United States Patent
Chinnadurai et al.

(10) Patent No.: US 9,076,275 B2
(45) Date of Patent: Jul. 7, 2015

(54) VEHICLE MEASUREMENT APPARATUS HAVING A SYSTEM-ON-A-CHIP DEVICE AND A SENSOR

(71) Applicant: SERVICE SOLUTIONS U.S. LLC, Warren, MI (US)

(72) Inventors: Manokar Chinnadurai, Owatonna, MI (US); Marco Le Brun, Florence (IT)

(73) Assignee: Bosch Automotive Service Solutions Inc., Warren, MI (US)

( * ) Notice: Subject to any disclaimer, the term of this patent is extended or adjusted under 35 U.S.C. 154(b) by 93 days.

(21) Appl. No.: 13/801,346

(22) Filed: Mar. 13, 2013

(65) Prior Publication Data
US 2014/0277827 A1 Sep. 18, 2014

(51) Int. Cl.
| | |
|---|---|
| G01R 31/28 | (2006.01) |
| G06F 11/27 | (2006.01) |
| G07C 5/00 | (2006.01) |
| G06F 17/50 | (2006.01) |
| G01R 31/3185 | (2006.01) |
| G01R 31/3177 | (2006.01) |
| G01M 17/007 | (2006.01) |
| G06F 11/273 | (2006.01) |
| G06F 11/26 | (2006.01) |
| H04L 29/08 | (2006.01) |

(52) U.S. Cl.
CPC ............ *G07C 5/008* (2013.01); *G06F 17/5027* (2013.01); *G06F 11/26* (2013.01); *H04L 67/12* (2013.01); *G01R 31/318519* (2013.01); *G01R 31/3177* (2013.01); *G01M 17/007* (2013.01); *G01R 31/318536* (2013.01); *G06F 11/2733* (2013.01); *G06F 17/5054* (2013.01); *G06F 11/27* (2013.01)

(58) Field of Classification Search
CPC .................. G01R 31/3177; G01R 31/318519; G01R 31/318536; G06F 17/5027; G06F 17/5054; G06F 11/2733; G06F 11/27; G06F 11/26; H04L 67/12; G01M 17/007
USPC ......... 701/1; 716/111, 138; 714/30, 726, 734; 73/488, 659
See application file for complete search history.

(56) References Cited

U.S. PATENT DOCUMENTS

| | | | |
|---|---|---|---|
| 6,460,172 B1 * | 10/2002 | Insenser Farre et al. | 326/38 |
| 6,760,898 B1 * | 7/2004 | Sanchez et al. | 716/111 |
| 7,073,110 B1 * | 7/2006 | Jacobson | 714/726 |
| 7,084,751 B2 | 8/2006 | Klamer | |
| 7,519,879 B2 * | 4/2009 | Woodward et al. | 714/724 |

(Continued)

FOREIGN PATENT DOCUMENTS

JP 2009-047694 A 3/2009

OTHER PUBLICATIONS

Xilinx, Inc.: "Xilinx Automotive ZYNQ-7000 All Programmable SOCS," pp. 1-4, San Jose, CA., 2012.

(Continued)

*Primary Examiner* — Russell Frejd
(74) *Attorney, Agent, or Firm* — Baker & Hostetler LLP (57) ABSTRACT

A vehicle measurement apparatus and a method for measuring vehicle data are provided. For example, the vehicle measurement apparatus includes a system-on-a-chip (SoC) device configured to integrate a programmable module with a microcontroller unit to receive vehicle data, process the vehicle data, and communicate the processed vehicle data to a remote computer.

20 Claims, 3 Drawing Sheets

(56) References Cited

U.S. PATENT DOCUMENTS

| | | |
|---|---|---|
| 7,562,001 B2 * | 7/2009 | Arevalo et al. .................. 703/14 |
| 7,876,252 B1 * | 1/2011 | Wegener ........................ 341/155 |
| 2003/0093187 A1 * | 5/2003 | Walker .............................. 701/1 |
| 2006/0064232 A1 | 3/2006 | Ampunan et al. |
| 2006/0206246 A1 * | 9/2006 | Walker ............................ 701/16 |
| 2007/0050758 A1 * | 3/2007 | Arevalo et al. ................ 717/135 |
| 2008/0224892 A1 | 9/2008 | Bogolea et al. |
| 2010/0052653 A1 | 3/2010 | Lebrun |
| 2010/0057388 A1 | 3/2010 | Lebrun |
| 2011/0250931 A1 * | 10/2011 | Pande et al. ................... 455/566 |
| 2011/0251807 A1 | 10/2011 | Rada et al. |
| 2012/0066079 A1 * | 3/2012 | Falzone et al. .................. 705/16 |
| 2012/0082196 A1 * | 4/2012 | Hurwitz et al. ................ 375/222 |
| 2012/0213098 A1 * | 8/2012 | Sun ................................ 370/252 |

OTHER PUBLICATIONS

USB Implementers Forum, Inc.: "USB Battery Charging 1.2 Compliance Plan," pp. 1-165, Oct. 12, 2011.

Notification of Transmittal of the International Search Report and the Written Opinion of the International Searching Authority, or the Declaration issued Jul. 16, 2014 in International Application No. PCT/US2014/025995.

* cited by examiner

VEHICLE MEASUREMENT APPARATUS HAVING A SYSTEM-ON-A-CHIP DEVICE AND A SENSOR

FIELD OF THE DISCLOSURE

The present disclosure relates generally to diagnostic equipment and method. More particularly, the present disclosure relates to a vehicle measurement apparatus having a system-on-a-chip device and a sensor.

BACKGROUND OF THE DISCLOSURE

A conventional vehicle measurement apparatus (e.g., an oscilloscope) includes a Field Programmable Gate Array (FPGA) separated from a microprocessor unit (MCU) by a galvanic isolation. The galvanic isolation separating the FPGA and the MCU reduces the interference between an analog section of the measurement apparatus, which receives external signals under test, and a digital section that communicates with an external computing device.

Unfortunately, such an arrangement increases component cost and size of the measurement apparatus, and has higher power consumption. Further, such a conventional measurement apparatus is inflexible in its design. A need exists to increase the flexibility of conventional measurement apparatus.

SUMMARY OF THE INVENTION

According to one embodiment, an oscilloscope is provided. The oscilloscope includes a circuit board having a sensor and a programmable system-on-a-chip (SoC) device coupled to the sensor. The SoC device is programmed to implement a field programmable gate array to receive vehicle data from the sensor, and a microcontroller unit to process the received vehicle data.

According to another embodiment, a method of measuring vehicle data using a vehicle measurement apparatus is provided. The method may include receiving, at a system-on-a-chip (SoC) device in the vehicle measurement apparatus, vehicle data that was sensed by a sensor in the vehicle measurement apparatus, the sensor and the SoC device coupled to each other on a common circuit board. The method may include processing, at the SoC device, the received vehicle data. The method may include communicating, using a wireless module in the vehicle measurement apparatus, the processed vehicle data to a remote computer.

According to another embodiment, a wireless oscilloscope is provided. The wireless oscilloscope may include a system-on-a-chip (SoC) device wherein one or more sensors are either stacked over/under the SoC device. The sensor may be used for detecting acoustic, pressure, vibration, accelerometer, motion, or any signals.

According to another embodiment, a wireless oscilloscope is provided. The wireless oscilloscope may include a system-on-a-chip (SoC) and a sensor. The SoC and the sensor may be fabricated from a same substrate and disposed in a common housing.

According to another embodiment, a wireless oscilloscope is provided. the wireless oscilloscope may include a system-on-a-chip (SoC) device programmed to implement a microprocessor integrated with a programmable module on a circuit board. The wireless oscilloscope may include a micro-electromechanical system (MEMS) sensor coupled on the circuit board and provides vibration or acceleration data associated with a vehicle to the SoC device for processing. The wireless oscilloscope may include a wireless module coupled on the circuit board and to the SoC device to wirelessly transmit the processed vibration or acceleration data received from the SoC device.

According to yet another embodiment, a vehicle measurement apparatus includes a system-on-a-chip (SoC) device configured to integrate a programmable module with a microcontroller unit to receive vehicle data, process the vehicle data, and communicate the processed vehicle data to a remote computer.

There has thus been outlined, rather broadly, certain embodiments in order that the detailed description thereof herein may be better understood, and in order that the present contribution to the conventional art may be better appreciated. There are, of course, additional embodiments of the invention that will be described below, which will form the subject matter of the claims appended hereto.

In this respect, before explaining at least one embodiment in detail, it is to be understood that the disclosure is not limited in its application to the details of construction and to the arrangements of the components set forth in the following description or illustrated in the drawings. The disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, apparatii, methods and systems for carrying out the several purposes of the present disclosure. It is important, therefore, that the claims be regarded as including such equivalent constructions insofar as they do not depart from the spirit and scope of the present disclosure.

DETAILED DESCRIPTION

Figure 1:
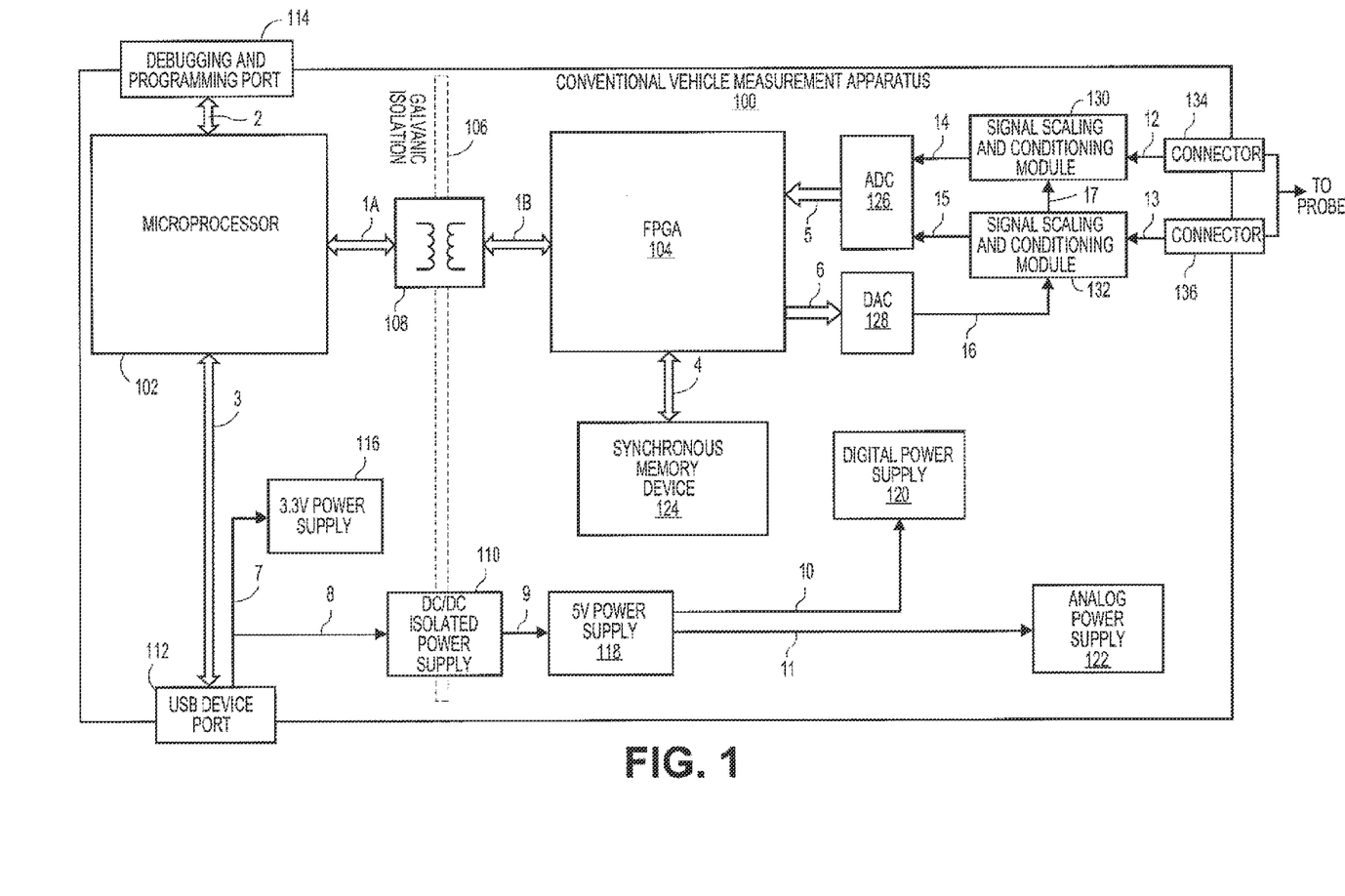
FIG. 1 is a schematic block diagram illustrating a conventional vehicle measurement apparatus.

Referring to FIG. 1, a schematic block diagram of a conventional vehicle measurement apparatus 100 is illustrated. Conventional vehicle measurement apparatus 100 includes a microprocessor 102 in electrical communication with a field programmable gate array (FPGA) 104. Microprocessor 102 is separated from FPGA 104 by a galvanic isolation 106. Galvanic isolation 106 is coupled to a transformer 108, which couples microprocessor 102 with FPGA 104 electrically. Microprocessor 102 is coupled to transformer 108 by a connection 1A, and to FPGA 104 by a connection 1B. One side of galvanic isolation 106 that includes FPGA 104 and other components forms an analog portion of conventional vehicle measurement apparatus 100. Another side of galvanic isolation 106 that includes microprocessor 102 forms a digital portion of conventional vehicle measurement apparatus 100.

The digital portion of conventional vehicle measurement apparatus 100 may include a debugging and programming port 114 coupled to microprocessor 102 by a connection 2. Microprocessor 102 is coupled to a universal serial bus (USB)

port 112 by a connection 3. USB port 112 is coupled to a 3.3V power supply 116 by a connection 7, and to a direct current-to-direct current (DC/DC) isolated power supply 110 by a connection 8. Conventional vehicle measurement apparatus 100 may include other electrical or electronic components in the digital portion, in addition to the components described above. Additionally, some components, for example, transformer 108 and DC/DC isolated power supply 110 may be shared between the digital and the analog portions of conventional vehicle measurement apparatus 100, as illustrated in FIG. 1.

The analog portion of conventional vehicle measurement apparatus 100 may include a 5V power supply 118 coupled to DC/DC isolated power supply 110 by a connection 9. 5V power supply 118 may in turn be coupled to a digital power supply 120 by a connection 10, and to an analog power supply 122 by a connection 11. Connectors 134 and 136 are connected to an external probe (not shown). Connectors 134 and 136 are also coupled to signal scaling and conditioning modules 130 and 132, respectively, by connections 12 and 13, respectively. Connections 12 and 13 carry analog data received from the probe that is placed on one or more parts of a machine under test (not shown). Such a machine may be a vehicle (e.g., a car), or any other machine that is to be tested. For example, a vehicle engine may be tested for parameters such as vibrations, emissions, engine speed, acceleration, or other parameters, using the probe that is placed on a portion of the vehicle engine. The probe then provides analog signals to connectors 134 and 136 corresponding to the parameter(s) under consideration. Signal scaling and conditioning modules 130 and 132 are coupled to each other by a connection 17. Signal scaling and conditioning modules 130 and 132 are both coupled to an analog to digital converter (ADC) 126 by connections 14 and 15, respectively. ADC 126 is coupled to FPGA 104 by a connection 5 and FPGA 104 is coupled to a digital to analog converter (DAC) 128 by a connection 6, which is in turn coupled to signal scaling and conditioning module 132 by a connection 16. FPGA 104 may be coupled to a synchronous memory device 124 by a connection 4.

However, conventional vehicle measurement apparatus 100 suffers from many drawbacks and problems. For example, galvanic isolation 106 used to reduce interference between the analog and digital components of conventional vehicle measurement apparatus 100 increases the bulkiness or weight of conventional vehicle measurement apparatus 100. As a result, the size of conventional vehicle measurement apparatus 100 increases or is not optimum. Presence of transformer 108 leads to transformer losses, and also adds to the weight of conventional vehicle measurement apparatus 100. In addition, DC/DC isolated power supply 110 also increases the number of components of conventional vehicle measurement apparatus 100 as well as the complexity of circuitry inside. DC/DC isolated power supply 110 does not fully eliminate dangerous current loops that might leak into a ground path of conventional vehicle measurement apparatus 100. Further, the increased number of components is related to the problem of inability to add more components, such as sensors, internally to conventional vehicle measurement apparatus 100. In this respect, the design of conventional vehicle measurement apparatus 100 is hard to modify, and is therefore, inflexible. Furthermore, communication between microprocessor 102 and FPGA 104 is hindered by limited bandwidth of connections 1A and 1B. Generally, conventional vehicle measurement apparatus 100 has circuit boards whose dimensions are quite large and are not optimized.

Figure 2:
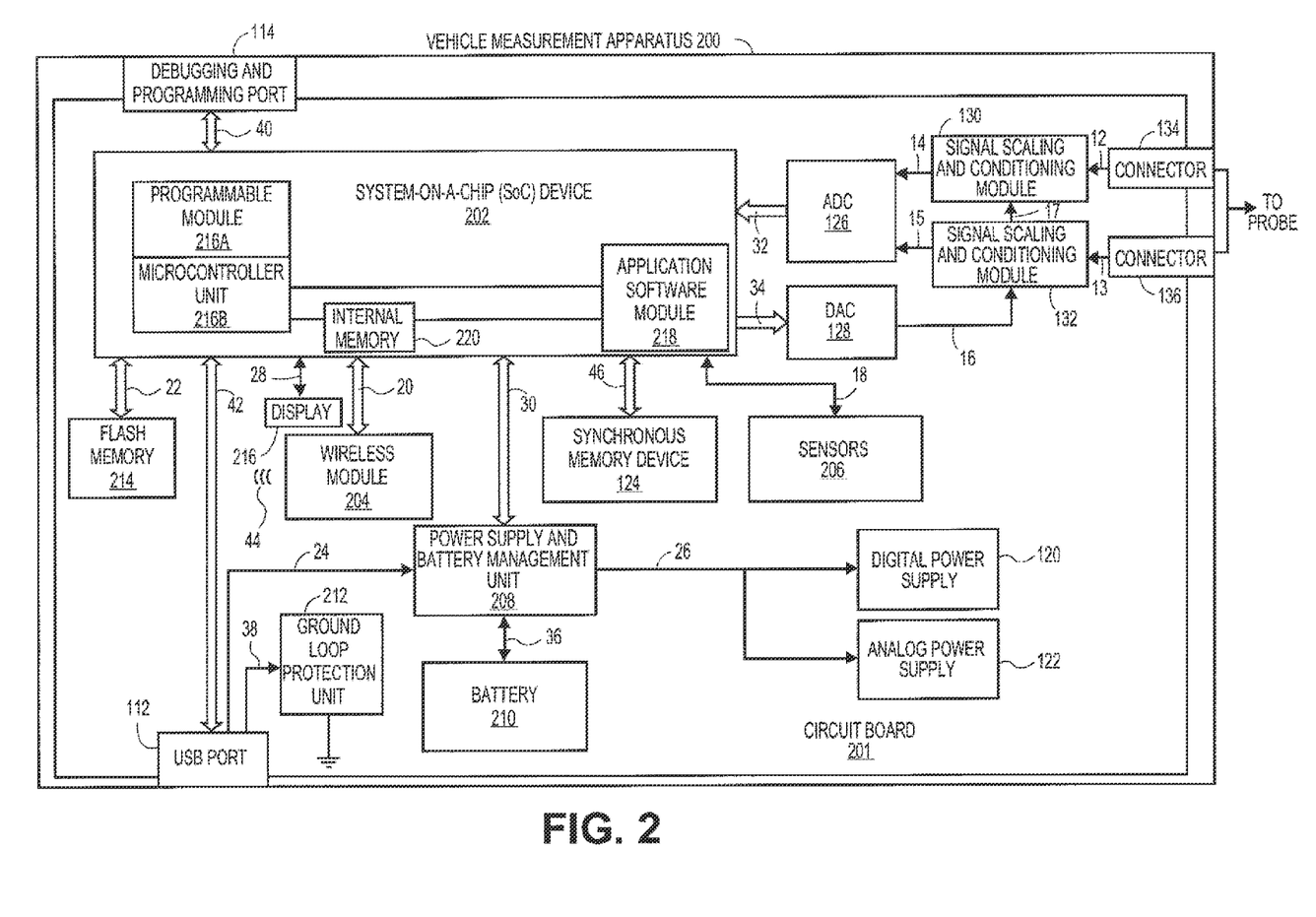
FIG. 2 is a schematic diagram illustrating a vehicle measurement apparatus, in accordance with an embodiment of the disclosure.

Referring to FIG. 2, a schematic diagram of a vehicle measurement apparatus 200 is illustrated, in accordance with an embodiment of the present disclosure. In FIG. 2, reference numerals for drawing elements common with FIG. 1 remain same. The term "vehicle" relates to a machine, for example, an automobile, a truck, ship, airplane, a turbine, a generator, etc., or to a part thereof (e.g., an engine). Vehicle measurement apparatus 200 may be an oscilloscope, a wireless oscilloscope, a vehicle oscilloscope, an automotive oscilloscope, a multi-meter, a vehicle multi-meter, a wireless multi-meter, an automotive multi-meter, or other types of electronic, electrical, or electromechanical measurement apparatii for measuring and analyzing machine parameters. In one embodiment, vehicle measurement apparatus 200 is arranged to be couplable to a part of the machine (e.g., a vehicle). For example, vehicle measurement apparatus 200 is couplable to an engine part of an automobile under a hood of the automobile. One or more measurements may be taken using vehicle measurement apparatus 200. In one embodiment, vehicle measurement apparatus 200 may have a hard outside cover for environmental protection, or for operation in harsh or hazardous environment. For example, vehicle measurement apparatus 200 may be used in a high temperature environment, a toxic gas environment, or other environments harmful to vehicle measurement apparatus 200. In one embodiment, vehicle measurement apparatus 200 is light weight and small sized to reach otherwise inaccessible parts of machines. Further, as discussed herein, vehicle measurement apparatus 200 is adapted to communicate with an external computing device (e.g., a remote computer, not shown). Such communication may be wireless, wired, or both. For example, vehicle measurement apparatus 200 may communicate with a computer located away from where vehicle measurement apparatus 200 is coupled to the machine. For example, such a computer may be located inside a passenger compartment area of a vehicle. Likewise, vehicle measurement apparatus 200 may communicate with more than one external computing device simultaneously. For example, measurements obtained by vehicle measurement apparatus 200 may be transmitted to a personal computer, a mobile phone, a tablet computer, etc. In one embodiment, vehicle measurement apparatus 200 may receive one or more instructions from such an external computing device, such as updates to software or operating system of vehicle measurement apparatus 200. In one embodiment, vehicle measurement apparatus 200 is a mobile or portable device (e.g., a handheld device). Alternatively, vehicle measurement apparatus 200 may not be a mobile device. For example, vehicle measurement apparatus 200 may be fixed to a part of a machine as a monitoring device for testing the machine in use. In one embodiment, a body of vehicle measurement apparatus 200 may have one or more ports, power switches, antennas, power inlets, a security lock, one or more slits for fluid flow, etc. In one embodiment, vehicle measurement apparatus 200 may have a receptacle or a recess to couple external battery pack or other adapters (e.g., a wireless adapter).

In one embodiment, vehicle measurement apparatus 200 includes a circuit board 201, such as a printed circuit board (PCB). Circuit board 201 includes a system-on-a-chip (SoC) device 202 (interchangeably referred to herein as a programmable SoC device 202), a wireless module 204 coupled to SoC device 202 by a connection 20, a sensor(s) 206 coupled to SoC device 202 by a connection 18, a display 216 coupled to SoC device 202 by a connection 28, a power supply and battery management unit 208 coupled to SoC device 202 by a connection 30, and a flash memory 214 coupled to SoC device 202 by a connection 22. In one embodiment, circuit board 201 includes ADC 126 and DAC 128 coupled to SoC device 202 by connections 32 and 34, respectively. In one embodiment, circuit board 201 includes a battery 210 coupled to power supply and battery management unit 208 by a connection 36. In one embodiment, circuit board 201 includes a ground loop protection unit 212 coupled to USB port 112 by a connection 38. In one embodiment, power supply and battery management unit 208 is coupled to USB port 112 by a connection 24 at an input terminal (not shown), and to digital power supply 120 and analog power supply 122 at an output terminal (not shown) by connection 26. In one embodiment, circuit board 201 includes other components similar to those in conventional vehicle measurement apparatus 100 such as connectors 134 and 136, signal scaling and conditioning modules 130 and 132, and debugging and programming port 114. For example, debugging and programming port 114 is coupled to SoC device 202 by a connection 40. Further, circuit board 201 may include additional components such has heat sinks, electrostatic protection circuits, etc., known to those having ordinary skill in the art. It is to be noted that the connections in FIG. 2 similar to those discussed with respect to FIG. 1 are not being discussed again herein. In one embodiment, vehicle measurement apparatus 200 may include one or more other circuit boards, different and physically separated from circuit board 201, although such circuit boards may be electrically coupled to circuit board 201.

In one embodiment, SoC device 202 is a programmable SoC device. In one embodiment, SoC device 202 is an integrated chip (IC) hard wired to circuit board 201. A packaging of SoC device 202 protects it from external electromagnetic fields. Additionally, such packaging protects internal circuitry of SoC device 202 from interference between analog and digital signals in vehicle measurement apparatus 200. By way of example only and not by way of limitation, SoC device 202 may be a ZYNQ-7000® series of all-purpose programmable SoC devices provided by Xilinx Inc. of San Jose, Calif. programmed to implement features and functionalities of the one or more embodiments discussed herein.

In one embodiment, SoC device 202 includes a programmable module 216a integrated with a microcontroller unit 216b, an internal memory 220, and an application software module 218. SoC device 202 is programmable via debugging and programming port 114. Since, programmable module 216a and microcontroller unit 216b are integrated with each other in SoC device 202, a high bandwidth communication occurs between programmable module 216a and microcontroller unit 216b. The term "integrated" relates to programmable module 216a and microcontroller unit 216b being integrated in SoC device 202 or having functionalities within a single chip, which in this embodiment is SoC device 202. For example, programmable module 216a and microcontroller unit 216b are integrated on a common substrate of SoC device 202. In this example, programmable module 216a and microcontroller unit 216b may not be separate discrete hardware elements inside SoC device 202. Instead, programmable module 216a and microcontroller unit 216b may be implemented on the same hardware area of SoC device 202 (e.g., using same programmable logic circuitry). Such integration of programmable module 216a and microcontroller unit 216b advantageously removes the requirement of galvanic isolation 106, as found in conventional vehicle measurement apparatus 100. Since there is no galvanic isolation 106 and/or transformer 108 in vehicle measurement apparatus 200, vehicle measurement apparatus 200 can be smaller and lighter with fewer components than conventional vehicle measurement apparatus 100. Further, such integration ameliorates the problem of interference between analog and digital portions of vehicle measurement apparatus 200.

In one embodiment, SoC device 202 may be programmed to implement functionalities of both FPGA 104 and microprocessor 102. For example, FPGA 104 may be implemented by programming programmable module 216a, and microprocessor 102 may be implemented using microcontroller unit 216b. Alternatively or additionally, programmable module 216a may be configured as a programmable logic controller or an application specific circuit in SoC device 202. In one embodiment, programmable module 216a receives vehicle data (e.g., automotive data) from sensor 206, and may perform digital signal processing (DSP) operations on such received data. Alternatively or additionally, programmable module 216a may receive vehicle data from ADC 126, and may be sent to microcontroller unit 216b for processing. Additionally, SoC device 202 may transmit digital data to DAC 128 over connection 34 to further scale and/or condition the received vehicle data at signal scaling and conditioning module 132. Programming of SoC device 202 to implement programmable module 216a and microcontroller unit 216b (or, functionalities of programmable module 216a and microcontroller unit 216b) is discussed with respect to FIG. 3.

In one embodiment, application software module 218 may be a set of instructions that are executed by microcontroller unit 216b to process vehicle data. As discussed herein, such vehicle data is associated with one or more parameters of a machine, or a part thereof, under test. Such vehicle data may be obtained initially as analog signals using a probe (not shown) connected to circuit board 201 at connectors 134 and 136. After scaling and conditioning by signal scaling and conditioning modules 130 and 132, and conversion to digital data by ADC 126, SoC device 202 can use application software module 218 to analyze the vehicle data. The set of instructions that comprise application software module 218 may reside on internal memory 220.

In one embodiment, internal memory 220 may a tangible non-transitory memory that is used by programmable module 216a and microcontroller unit 216b. For example, internal memory 220 may be a type of random access memory (RAM), although other types of on-chip memory implementations may be used.

SoC device 202 may include other components such as clock circuitry, interrupt handling routines, central interconnect logic, input-output (IO) interfaces, memory access controllers, wireless communication controller(s), wired communication controller(s), look-up tables (LUTs), signal and voltage management circuitry, etc. For example, SoC device 202 interfaces with other components of circuit board (e.g., sensor 206) via output pins. Such output pins of SoC device 202 may be hard wired to trace routes of circuit board 201, as known to one of ordinary skill in the art.

In one embodiment, SoC device 202 can be configured to communicate processed vehicle data to an external computing device (not shown). In this respect, the term "external" relates to any device outside vehicle measurement device 200. Such communication may occur over wired or wireless channels. For example, SoC device 202 may communicate vehicle data processed by microcontroller unit 216b to USB port 112 over a connection 42. A computer connected externally at USB port 112 though a wired connection (e.g., a USB cable) may then display such processed vehicle data. Likewise, SoC device 202 may communicate the processed vehicle data to wireless module 204 over connection 20. Wireless module 204 may then wirelessly transmit the processed vehicle data to the external computing device through a wireless transmission 44.

In one embodiment, connectors 134 and 136 receive vehicle data in an analog form (e.g., as analog signals). Such data corresponds to one or more parameters of a machine under test. For example, such parameters, collected at a probe (not shown), are measurements corresponding to vibration or acceleration of a machine part. Other examples of parameters may include measurements related to rotation speed of an engine (e.g., in rotations per minute), emissions from an exhaust of an engine, engine temperature, or other parameters of machine testing known to those of ordinary skill in the art. By way of example only, connectors 134 and 136 that receive such vehicle data may be Bayonet Neill-Concelman (BNC) type connectors, although other types of connectors known to one of ordinary skill in the art may be used.

In one embodiment, data received by connectors 134 and 136 is scaled and conditioned by signal scaling and conditioning modules 130 and 132. Received vehicle data may be sent over separate channels to signal scaling and conditioning modules 130 and 132 such that each of signal scaling and conditioning modules 130 and 132 forms a separate channel for analog vehicle data received as analog signals by connectors 134 and 136, respectively. In one embodiment, received vehicle data may not need signal scaling and/or conditioning. Circuit details of signal scaling and conditioning modules 130 and 132 are known to those of ordinary skill in the art, and will not be described herein.

In one embodiment, received vehicle data, after scaling and/or conditioning, may be converted to digital format by ADC 126. By way of example only, ADC 126 may be a 12-bit, 40 Msps, two channel type ADC. An output of ADC 126 is coupled to SoC device 202 by connection 32.

Likewise, DAC 128 may receive an 8-bit output from SoC device 202. Such digital output from SoC device 202 may be converted to analog signals for further scaling and conditioning by signal scaling and conditioning modules 130 and 132, for example.

In one embodiment, circuit board 201 includes sensor 206, which may share space on circuit board 201 with SoC device 202. In this respect, circuit board 201 is a common circuit board for SoC device 202 and sensor 206. Sensor 206 can be coupled to and in direct communication with SoC device 202. Such a direct communication and coupling is implemented using, for example, a trace on circuit board 201, shown as connection 18. In one embodiment, sensor 206 may be either stacked over/under SoC device 202. In one embodiment, sensor 206 and SoC device 202 may be fabricated from a same substrate and disposed in a common housing. Sensor 206 measures vehicle data associated with a parameter (e.g., vibration) of a part of a machine (e.g., an automobile engine). In one embodiment, sensor 206 is a vibration sensor, which can measure vibration of a machine or a part thereof to which vehicle measurement apparatus 200 is coupled. In one embodiment, sensor 206 is an acceleration sensor, which can measure acceleration of a machine or a part thereof to which vehicle measurement apparatus 200 is coupled. Likewise sensor 206 may be used to measure other machine parameters known to ordinary skill in the art, for example but not limited to detecting acoustic, pressure, vibration, accelerometer, motion, or any signals. In one embodiment, sensor 206 is a micro-electromechanical system (MEMS) sensor. Depending on the parameter being measured, sensor 206 may be a MEMS vibration sensor or a MEMS acceleration sensor, or other type of MEMS sensor. An example advantage of circuit board 201 having sensor 206 hardwired thereto is that a user of vehicle measurement apparatus 200 can get more accurate readings for processing by SoC device 202 due to close physical proximity of sensor 206 to SoC device 202. Sensor 206 hardwired to circuit board 201 also results in a more compact design of vehicle measurement apparatus 200. In one embodiment, sensor 206 may be in an IC package.

In one embodiment, power supply and battery management unit 208 can be configured to control power supplied to SoC device 202 over connection 30. Power supply and battery management unit 208 forms a common control point for digital power supply 120, analog power supply 122, and battery 210. In one embodiment, power supply and battery management unit 208 may receive instructions to intelligently manage power distribution in circuit board 201 from an external computing device via USB port 112. For example, of power supply and battery management unit 208 may include one or more switches to electronically toggle between power from an external computing device, battery 210, digital power supply 120, and analog power supply 122.

In one embodiment, digital power supply 120 may provide power to digital components of circuit board 201, including power to SoC device 202. Digital power supply 120 may be, for example, a 3.3V or a 1.2V power supply. Likewise, analog power supply 122 provides power to analog components of circuit board 201. For example, analog power supply 122 may provide power, such as 3V, a 5V, or a −5V, to signal scaling and conditioning modules 130 and 132. In one embodiment, either one of or both digital power supply 120 and analog power supply 122 may be operable to provide different voltage levels.

In one embodiment, battery 210 is chargeable through USB port 112 over connection 36 via connection 24. For example, battery 210 is chargeable at a rate of up to 1.5 A through USB port 112, in accordance with "USB Battery Charging 1.2 Compliance plan" by USB Implementers Forum Inc., dated Oct. 12, 2011. In one embodiment, battery 210 supplies power to SoC device 202. For example, when vehicle measurement apparatus 200 is used as a mobile or portable device, or when mains supply power is not available, battery 210 provides power to SoC device 202 as well as to other components of circuit board 201. Battery 210 may be a Lithium ion, Lithium Oxygen, Lithium air, or air cell battery, although other types of batteries known to one of ordinary skill in the art may be used.

In one embodiment, wireless module 204 includes circuitry and antenna to implement wireless communication with an external computing device (not shown). By way of example only, wireless module 204 may be a Bluetooth wireless communication protocol device, NFC (Near Field Communication), a WiFi™ wireless communication protocol device, or other wireless communication protocol device based on IEEE 802.11 standard known to one of ordinary skill in the art. An advantage of using the Bluetooth protocol is that it is simpler to implement and has lower power requirements as compared to WiFi® protocol. However, as known to one of ordinary skill in the art, WiFi® protocol is more secure. In one embodiment, wireless module 204 may be optional. Incorporating wireless module 204 advantageously removes the need for galvanic isolation 106 of conventional vehicle measurement apparatus 100. This results in a simplified power supply design for vehicle measurement apparatus 200.

In one embodiment, display 216 may be a light emitting diode (LED) 7-segment display, although other types of displays known to one of ordinary skill in the art could be used such as a touch-screen display, an organic LED (OLED) display, etc. Display 216 may indicate various status indicators for SoC device 202. Display 216 may obtain such status messages over connection 28. For example, the status messages may read, for example, "POWER ON", "POWER OFF", "IDLE", "BUSY", or other types of status messages known to one of ordinary skill in the art. In one embodiment, display 216 may be optional.

In one embodiment, synchronous memory device 124 may be a random access memory (RAM). Synchronous memory device 124 may supplement internal memory 220 if a memory capacity of internal memory 220 is not sufficient to carry out functioning of SoC device 202. By way of example only, synchronous memory device may be a 1.152 MB synchronous static RAM. In one embodiment, synchronous memory device 124 may be optional, for example, when SoC device 202 has sufficient internal memory 220.

Likewise, in one embodiment, flash memory 214 may be a temporary buffer type memory. SoC device 202 during course of operation may store temporary results or variables in flash memory 214. Similar to synchronous memory device 124, flash memory 214 may be optional. By way of example only, flash memory 214 may be a NAND or a NOR type flash memory known to one of ordinary skill in the art.

In one embodiment, vehicle measurement apparatus 200 includes a ground loop protection unit 212 coupled to USB port 112 by connection 38, although other types of ports, including coaxial cable type ports, may be used. For example, when vehicle measurement apparatus 200 is used with a wired connection via USB port 112, galvanic isolation 106 in conventional vehicle measurement apparatus 100 is replaced with ground loop protection unit 212 that protects vehicle measurement apparatus 200, the external computing system, and circuits external to circuit board 201 from destructive currents due to shorts through a ground path of vehicle measurement apparatus 200. Such protection is attained by ground loop protection unit 212 preventing or safely grounding one or more current loops that may leak to non-ground traces of circuit board 201 and cause damage to vehicle measurement apparatus 200.

In one embodiment, connections 18, 20, 22, 24 26, 28, 30, 32, 34, 36, 38, 40, 42, and 46 are traces on circuit board 201. Bi-directional arrows (single-lined or double) are used to indicate full-duplex communications or signal flows. Unidirectional arrows indicate simplex communications or signal flows. It is to be noted that circuit board 201 may have other additional connections, not shown, depending on additional components placed thereupon.

Figure 3:
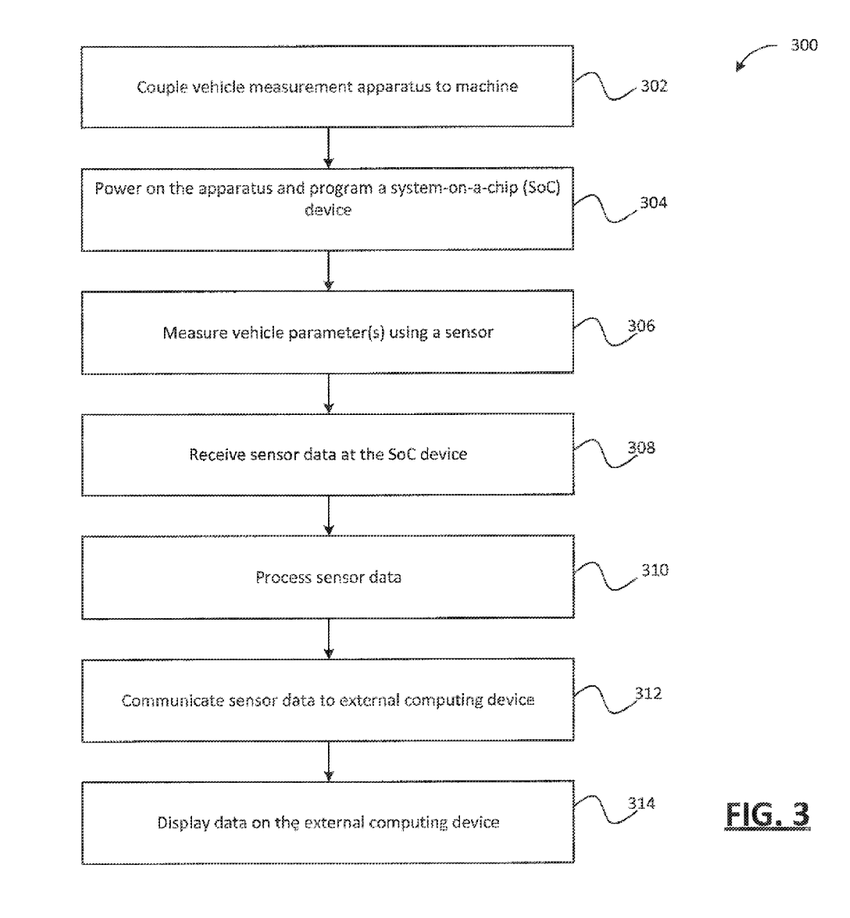
FIG. 3 is a flowchart for a method for measuring vehicle data, in accordance with an embodiment of the disclosure.

Referring to FIG. 3, a method 300 for measuring vehicle data using vehicle measurement apparatus 200 is illustrated as a flowchart. It is to be noted that although the operations shown in flowchart of method 300 are in increasing order, such operations are not restricted to any particular order. For example, the operations can be carried out independently, may be combined as a single operation, or may be optional under certain conditions, as will be apparent to one of ordinary skill in the art in view of the present disclosure.

In one embodiment, method 300 may begin an operation 302 where vehicle measurement apparatus 200 is coupled to a machine (e.g., an automobile) or a part thereof (e.g., under a car's hood). Such coupling of vehicle measurement apparatus 200 may be performed by a human user, or by a robot, or other type of machine. Coupling of vehicle measurement apparatus 200 may be carried out simply by placing vehicle measurement apparatus 200 on a part of the machine. For example, in certain scenarios, due to the advantageously small size of vehicle measurement apparatus 200, placement thereof may occur is small spaces between parts of an engine of a machine. Alternatively, coupling may be carried out using mechanical tools such as screws, clamps, latches, or other tools known to one of ordinary skill in the art. In one embodiment, vehicle measurement apparatus 200 itself may not be coupled directly to the machine. Instead, a probe connected to one or more connectors of vehicle measurement apparatus 200 (e.g., connectors 134 and 136) may be used to measure vehicle data associated with the machine or a part thereof. For example, the probe may be coupled to a vibrating or accelerating machine part to measure a vibration or acceleration thereof, respectively.

In one embodiment, in an operation 304, vehicle measurement apparatus 200 may be powered on. Such powering on may be carried out by flipping a switch on an outside surface of the body of vehicle measurement apparatus 200. Alternatively, vehicle measurement apparatus 200 may be powered on using a remote control operated by a user. Upon power on of vehicle measurement apparatus 200, SoC device 202 may be programmed. Programming SoC device 202 is carried out via debugging and programming port 114 coupled to circuit board 201, as illustrated in FIG. 2 for example. For example, programming SoC device 202 may be carried out from an external graphical user interface on an external computing device. For example, instructions on internal memory 220 may be executed to run application software module 218 in conjunction with the user interface of a programming language used to program SoC device 202. Programming SoC device 202, for example, using application software module 218, implements programmable module 216*a* and microcontroller unit 216*b* on a single IC chip, which is SoC device 202. For example, application software module 218 may be executed by on on-chip processor core (not shown) of SoC device 202. In this respect, using on-chip hardware of SoC device 202, such as memory areas of internal memory 220, the functionality of FPGA 104 and microprocessor 102 of conventional vehicle measurement apparatus 100 may be integrated on a single device, which is SoC device 202. In one embodiment, SoC device 202 may be hardware programmable as well as software programmable. For example, programming SoC device 202 may include initiation of one or more state variables that are used to enumerate one or more parameters of the machine measured by vehicle measurement apparatus 200. In one embodiment, Universal Markup Language (UML) or C programming language may be used to program SoC device 202.

In one embodiment, in an operation 306, vehicle measurement apparatus 200 measures one or more machine parameters. As discussed herein, such parameters may include vibration data, acceleration data, engine speed data, emission data, or other types of vehicle data known to those of ordinary skill in the art. Such measurements of vehicle data may be carried out via a probe attached to vehicle measurement apparatus 200, e.g., at connectors 134 and 136. Alternatively, in one embodiment such measurements may be carried out by sensor 206 on circuit board 201 of vehicle measurement apparatus 200. In one embodiment, multiple parameters of a machine may be measured using both the probe connected at connectors 134 and 134 as well as sensor 206.

In one embodiment, in an operation 308, SoC device 202 receives the measured vehicle data. In one embodiment, SoC device 202 may receive vehicle data from connectors 134 and 136. Connectors 134 and 134 output analog signals associated with the measured vehicle data. These analog signals are then scaled and/or conditioned by signal scaling and conditioning modules 130 and 132. Such scaling and conditioning of analog signals is known to one of ordinary skill in the art, and will not be described herein. One or more output channels of signal scaling and conditioning modules 130 and 132 provide the scaled and/or conditioned analog signals to ADC 126. ADC 126 converts the analog signals to digital signals that are provided to SoC device 202. For example, the received vehicle data in digital form is provided by ADC 126 to programmable module 216a of SoC device 202. In one embodiment, SoC device 202 may receive the measured vehicle data from sensor 206. SoC device 202 may receive the measured vehicle data from sensor 206 as a digital signal or an analog signal over connection 18. For example, sensor 206 may provide the received vehicle data in digital form to programmable module 216a of SoC device 202, when programmable module 216a is programmed as an FPGA. When sensor 206 outputs analog signals corresponding to the measured vehicle data, internal ADCs (not shown) of SoC device 202 may convert the received analog signals from sensor 206 to equivalent digital signals for processing. In this respect, SoC device 202 is programmed to receive both analog as well as digital signals. The ability of SoC device 202 in vehicle measurement apparatus 200 to handle both analog and digital signals makes SoC device 202 a mixed signal device.

In one embodiment, in an operation 310, SoC device 202 processes the received vehicle data. For example, such processing may begin at an internal ADC of SOC device 202 that converts a received analog signal to a digital format. When the received vehicle data is already in a digital format (e.g., received from ADC 126), such processing may include microcontroller unit 216b breaking the received digital data into bytes for processing. Additionally, such processing may involve performing digital signal processing (DSP) functions on the received vehicle data (e.g., for spectrum analysis), vibration analysis, advanced triggering and analysis of vehicle communication busses such as Controller Area Network (CAN) and FlexRay, analysis of vehicle battery ripple to extract information such as engine revolutions per minute (rpm), analysis of alternators' waveforms for test purposes, or other types of signal analyses that may be performed using programmable module 216a and microcontroller unit 216b of SoC device 202.

In one embodiment, in an operation 312, the processed vehicle data is communicated to an external computing device (e.g., a personal computer (PC)). Such communicating may occur wirelessly or over a wired channel. For example, SoC device 202 may communicate the processed vehicle data to wireless module 204 over connection 20. Wireless module 204 may initiate wireless transmission 44 to the external computing device. By way of example only, such communicating may be over a Bluetooth protocol or a WiFi® protocol. Alternatively, such communicating may occur through USB port 112 coupled to SoC device 202 by connection 42. In this example, a PC or other computing device may be connected to USB port 112's output to receive the processed vehicle data.

In one embodiment, in an operation 314, the processed vehicle data may be displayed on a display (not shown) of an external computing device. For example, a person sitting in a driver's seat of a car may be able to view vehicle data on a PC outside the hood of the car. Such displayed data may then be analyzed or presented in a format that allows a machine tester to learn about one or more parameters or performance of the machine.

The many features and advantages of the embodiments discussed herein are apparent from the detailed specification, and thus, it is intended by the appended claims to cover all such features and advantages which fall within the true spirit and scope of the embodiments. Further, since numerous modifications and variations will readily occur to those skilled in the art, it is not desired to limit the exact construction and operation illustrated and described, and accordingly, all suitable modifications and equivalents may be resorted to, falling within the scope of the embodiments in the present disclosure.

What is claimed is:

1. An oscilloscope, comprising:
   a circuit board, comprising:
   a sensor; and
   a programmable system-on-a-chip (SoC) device directly coupled to the sensor and programmed to implement:
   a field programmable gate array to receive vehicle data from the sensor, and
   a microcontroller unit to process the received vehicle data.

2. The oscilloscope of claim 1, wherein the sensor detects vibration or acceleration of at least a part of a vehicle.

3. The oscilloscope of claim 1, wherein the sensor is a micro-electromechanical system (MEMS) sensor.

4. The oscilloscope of claim 1, wherein the programmable SoC device is coupled to a wireless module to wirelessly transmit the processed vehicle data to a remote computer.

5. The oscilloscope of claim 1, wherein the circuit board further comprises a ground loop protection unit to protect the circuit board from a current loop in a ground path of the circuit board.

6. The oscilloscope of claim 1 further comprising:
   a universal synchronous bus (USB) port coupled to the programmable SoC device; and
   a battery to provide electrical power to the programmable SoC device, the battery being chargeable at a rate of up to 1.5 A through the USB port.

7. A method of measuring vehicle data using a vehicle measurement apparatus, the method comprising:
   providing, in the vehicle measurement apparatus, a common circuit board including a system-on-a-chip (SoC) device directly coupled to a sensor;
   receiving, at the SoC device, vehicle data sensed by the sensor;
   processing, at the SoC device, the received vehicle data; and
   communicating, using a wireless module in the vehicle measurement apparatus, the processed vehicle data to a computer.

8. The method of claim 7, wherein the vehicle data includes a vibration parameter or an acceleration parameter associated with a vehicle.

9. The method of claim 7, wherein the receiving step comprises receiving analog and digital signals at the SoC device.

10. The method of claim 7, wherein the processing step comprises performing digital signal processing on the received vehicle data.

11. The method of claim 7, wherein the vehicle data is associated with a vehicle, the method further comprising:
    coupling the vehicle measurement apparatus to a part that is under a hood of the vehicle; and
    displaying the processed vehicle data associated with the part on a display of the computer.

12. The method of claim 7 further comprising:
    programming the SoC device via a universal serial bus (USB) port coupled to the SoC device and to the computer.

13. A wireless oscilloscope, comprising:
    a system-on-a-chip (SoC) device programmed to implement a microprocessor integrated with a programmable module on a circuit board;
    a micro-electromechanical system (MEMS) sensor on the circuit board and configured to provide vibration or acceleration data associated with a vehicle to the SoC device for processing, the MEMS sensor being directly coupled to the SoC device on the circuit board; and a wireless module on the circuit board and coupled to the SoC device, the wireless module configured to wirelessly transmit the processed vibration or acceleration data received from the SoC device.

14. The wireless oscilloscope of claim 13, wherein the MEMS sensor is configured to measure the vibration or acceleration data associated with a part of the vehicle.

15. The wireless oscilloscope of claim 13, wherein the wireless module is a Bluetooth device.

16. The wireless oscilloscope of claim 13 further comprising:

a universal synchronous bus (USB) port coupled to the SoC device to send the processed vibration or acceleration data to a remote computer over a wired communication channel; and a ground loop protection unit coupled to the USB port to prevent a current loop from damaging the wireless oscilloscope.

17. The wireless oscilloscope of claim 13 further comprising:

a probe to measure the vibration or acceleration data of a part of the vehicle.

18. The wireless oscilloscope of claim 13, wherein the wireless oscilloscope is couplable to a part under a hood of the vehicle, and wherein the processed vibration or acceleration data of the part is displayed on a display of a remote computer.

19. The wireless oscilloscope of claim 13 further comprising:

a universal synchronous bus (USB) port coupled to the SoC device; and a battery to provide electrical power to the SoC device, the battery being chargeable at a rate of up to 1.5 A through the USB port.

20. A vehicle measurement apparatus, comprising:

a system-on-a-chip (SoC) device configured to integrate a programmable module with a microcontroller unit to receive vehicle data for a vehicle from a sensor directly coupled to the SoC device on a common circuit board, process the vehicle data, and communicate the processed vehicle data to a remote computer.

* * * * *